United States Patent
Sitarski

(10) Patent No.: US 8,456,180 B2
(45) Date of Patent: Jun. 4, 2013

(54) CAPACITIVE SWITCH REFERENCE METHOD

(75) Inventor: Nicholas Scott Sitarski, Ypsilanti, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 357 days.

(21) Appl. No.: 12/853,353

(22) Filed: Aug. 10, 2010

(65) Prior Publication Data
US 2012/0037485 A1 Feb. 16, 2012

(51) Int. Cl.
G01R 27/26 (2006.01)
G01R 35/00 (2006.01)
G06F 3/041 (2006.01)

(52) U.S. Cl.
USPC ............................ 324/679; 324/601; 345/173

(58) Field of Classification Search
USPC ....................................................... 324/679
See application file for complete search history.

(56) References Cited

U.S. PATENT DOCUMENTS

| | | | |
|---|---|---|---|
| 5,477,727 A | 12/1995 | Koga | |
| 6,218,947 B1 * | 4/2001 | Sutherland | 340/576 |
| 6,501,281 B1 * | 12/2002 | Rundo | 324/658 |
| 6,794,728 B1 | 9/2004 | Kithil | |
| 7,518,381 B2 * | 4/2009 | Lamborghini et al. | 324/679 |
| 7,795,882 B2 * | 9/2010 | Kirchner et al. | 324/686 |
| 2004/0262927 A1 * | 12/2004 | Fukunaga et al. | 292/216 |
| 2009/0096468 A1 * | 4/2009 | Hirota et al. | 324/681 |
| 2009/0256578 A1 * | 10/2009 | Wuerstlein et al. | 324/601 |

FOREIGN PATENT DOCUMENTS

JP 200580022035 * 8/2007

* cited by examiner

Primary Examiner — Jeff Natalini
(74) Attorney, Agent, or Firm — Gifford, Krass, Sprinkle, Anderson & Citkowski, P.C.

(57) ABSTRACT

An example capacitive switch apparatus comprises a capacitive switch sensor providing a capacitive switch signal, a capacitive reference sensor providing a capacitive reference signal, and an electronic circuit, receiving the switch and reference signals and detecting switch activation by comparing the switch signal level with a threshold level. The threshold level is adjusted as a function of the reference signal level. The reference signal is obtained, for example during periods of operator proximity to the reference sensor. For a finger-operated switch, the reference signal is obtained when a finger is proximate the reference sensor.

17 Claims, 4 Drawing Sheets

CAPACITIVE SWITCH REFERENCE METHOD

FIELD OF THE INVENTION

The invention relates to electrical switches, in particular to capacitive switches.

BACKGROUND OF THE INVENTION

Capacitive switches can replace mechanical switches in a variety of applications. However, conventional capacitive switches are prone to a variety of problems, such as nonresponsiveness, false triggering, and electrical noise.

SUMMARY OF THE INVENTION

Examples of the present invention include apparatus and methods related to an improved capacitive switch.

An example apparatus comprises a switch sensor, a reference sensor, and an electronic circuit receiving a sensor signal from the switch sensor and a reference signal from the reference sensor. The electronic circuit detects switch operation when the sensor signal crosses a threshold signal level. The threshold signal level is adjusted as a function of the reference signal, allowing improved operation of the capacitive switch. The electronic circuit used to adjust the threshold signal level may be a hardware circuit, or a microprocessor based circuit that adjusts the threshold via software. Examples below relate to a capacitive switch sensor and a capacitive reference sensor, but analogous approaches can be used with other switch technologies.

For example, in the case of a finger-operated capacitive switch, both the reference signal level and switch sensor level (in each case, when a finger is close) are correlated with certain physical properties of the finger. These properties include skin electrical conductivity, finger dimensions, the presence of a glove or other covering, and the like. Hence, by adjusting the threshold signal level as a function of the capacitive reference signal, improved operation of the capacitive switch can be obtained. The effects of the aforementioned finger physical properties on switch operation can be appreciably reduced.

In some examples, the threshold signal levels for a plurality of capacitive switch sensors may be adjusted as a function of one or more capacitive reference signals.

The capacitive reference signal is obtained from a capacitive reference sensor during periods of manual proximity to the capacitive reference sensor, or the presence of some other configuration similar to that used for switch operation.

Examples of the present invention include an improved capacitive switch apparatus for a vehicle. A capacitive reference sensor may be located within a vehicle steering control (such as a steering wheel), other control component associated with the vehicle (such as a power or adjustment control for a climate control apparatus, entertainment device, and the like), or a location likely to be touched by a vehicle operator in the process of entering and/or starting vehicle operation (such as an exterior or interior door-handle, armrest, seat adjustment control, or ignition key for the vehicle). The capacitive reference sensor may be located so that starting and operating the vehicle brings the hand of the vehicle operator proximate one or more capacitive reference sensors during typical operation.

The electronic circuit determines switch activation by comparing the capacitive switch signal with a threshold signal level, where the threshold signal level is adjusted as a function of a signal level of the capacitive reference signal.

The electronic circuit may be an analog or digital circuit, and in some examples may include a microprocessor. Software may be used to calculate an adjusted threshold signal level based on the reference signal levels obtained. Software and/or other circuitry can be further be used to determine when the reference sensor is providing a reference signal.

The capacitive reference signal may be obtained at intervals during vehicle operation, and the threshold level may be further adjusted as a function of changes in the capacitive reference signal. For example, a vehicle operator may remove a glove as the vehicle warms up, and this may be reflected in a changed level of reference signal.

The threshold level may be set to a predetermined value until a suitable reference level is obtained, which may, for example, be the previous threshold level used or an average of previous threshold levels.

An example method of detecting an activation of a capacitive switch (for example, within a vehicle) comprises obtaining a reference signal from a capacitive reference sensor when a hand of an operator is proximate the capacitive reference sensor, using the reference signal to determine a threshold level for switch activation, obtaining a capacitive switch signal from a capacitive switch sensor, and comparing the capacitive switch signal with the threshold level to detect activation of the capacitive switch.

In examples of the present invention, the threshold level for switch activation is adjusted as a function of a reference sensor signal. For example, if the reference signal changes by a reference value when an operator touches the reference sensor, the threshold value for one or more switch sensors can be adjusted as a function of the reference value. In some examples, the threshold value, as measured from an appropriate baseline, may be approximately or substantially equal to the reference value.

The threshold tolerance may be maintained at a constant absolute value as the threshold is adjusted. Alternatively, the tolerance may be a predetermined proportion of the threshold value, or otherwise related value.

DETAILED DESCRIPTION OF THE INVENTION

Figure 1A:
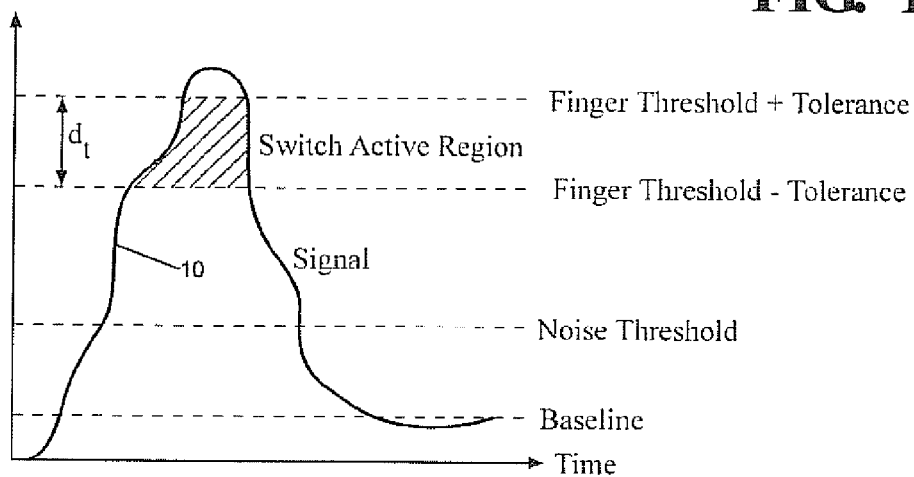
FIG. 1A shows operation of a conventional capacitive switch.

A conventional capacitive switch may comprise a capacitive switch sensor providing a sensor signal and an electronic circuit receiving the sensor signal. The electronic circuit uses a predetermined threshold to determine when the sensor signal corresponds to an "activated" state However, the sensor response depends on a number of factors, such as the size, conductivity, and physical state of e.g. a finger used to operate the switch. For example, a gloved hand may give a much smaller change in sensor signal, if a gloved finger is used to activate the switch.

The threshold used may have a tolerance, and broadening the tolerance allows smaller changes in the sensor signal to be registered as switch activation. However, this also makes the switch more sensitive to false operation, or misdetection of switch activation.

Hence, the optimum threshold level may vary considerably according to electrical parameters an operator's hand, such as skin conductivity, finger size, or the presence of dielectric or conducting elements on the hand of the operator (e.g. the presence of gloves, rings, and the like).

In examples of the present invention, the threshold level is adjusted as a function of the capacitive reference signal, so as to obtain a threshold level that is closer to an optimized level for the capacitive switch. Examples of the present invention allow adjustment of threshold levels to allow improved performance of a capacitive switch.

An example capacitive switch apparatus comprises a capacitive switch sensor providing a capacitive switch signal, a capacitive reference sensor providing a capacitive reference signal, and an electronic circuit, receiving the capacitive switch signal and the capacitive reference signal. The electronic circuit detects switch activation by comparing the switch signal with a threshold level. The electronic circuit used to adjust the threshold level(s) may be a hardware circuit, or a microprocessor based circuit that adjusts the threshold via software.

An apparatus may include one or more capacitive switch sensors and one or more capacitive reference sensors. The threshold level for each switch may be adjusted as a function of the capacitive reference signal(s).

In examples below, a reference sensor generally refers to a capacitive reference sensor, and a switch sensor refers to a capacitive switch sensor. The electronic circuit uses the reference signal to adjust the operational range over which the sensor signal corresponds to the activated state, and may be a micro-processor based circuit that adjusts the thresholds using an algorithm responsive to reference signal levels.

A capacitive switch may be finger-activated, and generally the capacitive switch signal increases as a response to increased sensor capacitance as the finger of the operator approaches the capacitive switch sensor. The capacitive reference sensor is used to obtain a capacitive reference signal when the finger of the operator is proximate the capacitive reference sensor. Finger proximity to the reference sensor may be determined by various methods. For example, if the reference sensor is located within a controller for vehicle heating and/or air conditioning, the reference signal may be determined as the controller is operated. A controller may be a dial or knob including a reference sensor, and in some examples may be a capacitive slide switch. In the latter example, capacitive slide switch sensors may be used to provide the reference signal.

The capacitive reference signal may be determined each time a hand (e.g. a finger) of the operator is proximate the capacitive reference sensor. The threshold may be appropriately adjusted each time a new reference signal is obtained, for example as a rolling average.

In some examples, a capacitive switch apparatus is used within a vehicle, for example to control operation of the vehicle (including accessories therein). The capacitive switch can be manually activated by a vehicle operator, for example by touching with a finger.

An example capacitive switch apparatus for a vehicle comprises a capacitive switch sensor operable to provide a capacitive switch signal, a capacitive reference sensor operable to provide a capacitive reference signal, and an electronic circuit, receiving the capacitive switch signal and the capacitive reference signal. The electronic circuit detects switch activation by comparing switch and threshold levels, for example activation being indicated when the switch signal level crosses a threshold level. The threshold level is adjusted as a function of the capacitive reference signal level. The electronic circuit used for adjusting the threshold(s) may include a microprocessor, and used to adjust the thresholds using software. For example, a software algorithm can be used to determine an adjusted threshold level using reference sensor signals.

The capacitive reference signal may be obtained during periods of vehicle operator hand proximity to the capacitive reference sensor. The capacitive reference signal level is used to adjust the threshold level, and may be an average level of some or all of the reference signal obtained. For example, the reference signal used to adjust the threshold level may be a signal level average, and may optionally exclude signal portions near the beginning and/or end of the collected signal.

The capacitive reference sensor can be located within a vehicle steering control, such as a steering wheel (in the case of an automobile), yoke, helm, joystick, and the like. The capacitive reference sensor may be located within a control component associated with the vehicle (such as a climate control adjuster or an entertainment device controller), a door-handle or armrest of the vehicle, ignition key, or other location.

In some examples, the reference signal may be provided by a portable electronic device, used by the vehicle operator, including one or more capacitive sensors. For example, a portable electronic device may become in electronic communication with the vehicle as the operator enters the vehicle, or soon after, allowing an appropriate reference signal to be provided.

The capacitive reference signal may be obtained at intervals during vehicle operation, for example each time the vehicle operator touches a component including a reference sensor. The threshold level may be further adjusted as a function of changes in the capacitive reference signal, for example as a rolling average.

A method of detecting an activation of a capacitive switch includes obtaining a reference signal from a capacitive reference sensor when a hand of the operator is proximate the capacitive reference sensor, using the reference signal to determine a threshold level for switch activation, obtaining a capacitive switch signal from a capacitive switch sensor, and comparing the capacitive switch signal with the threshold level to detect activation of the capacitive switch. For vehicular implementation, the capacitive reference sensor can be located so that a normal starting process, and/or operating process for the vehicle brings the hand of the vehicle operator proximate the capacitive reference sensor.

A capacitive sensor provides a sensor signal that is responsive to the proximity of a dielectric or conducting object. Any appropriate design of capacitive sensor can be used in capacitive switches, for example sensors including two or more conducting elements separated by a dielectric gap. As a person's finger approaches the sensor, the capacitance signal of the sensor may increase above threshold level (or otherwise be compared with the threshold level) allowing detection of switch activation.

Capacitive switches according to examples of the present invention can be used to replace conventional electrical switches, e.g. in automotive environments, and examples of the present invention include apparatus including such switches.

FIG. 1A illustrates a conventional switch operation. The figure shows capacitance value as a function of time. The peak in curve 10 corresponds to a finger approaching the sensor. In this example, the switch operates correctly, as the capacitance values goes above a threshold value.

Figure 1B:
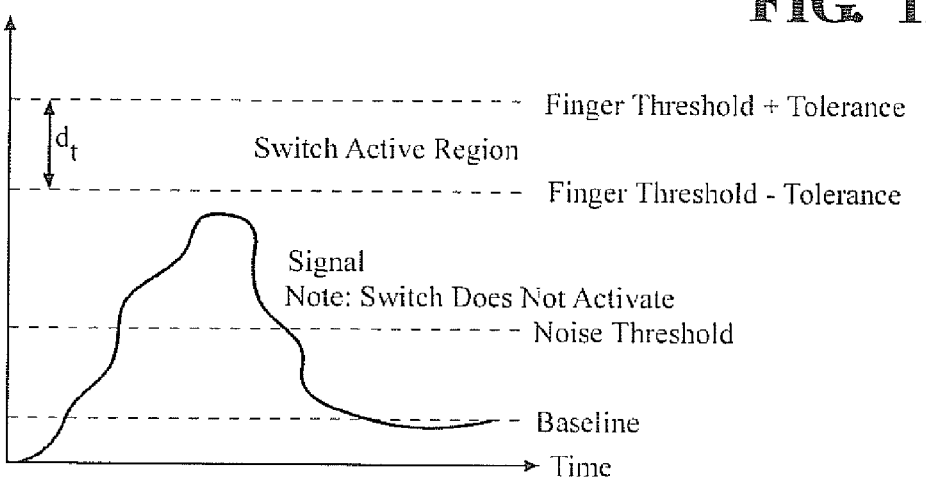
FIG. 1B shows erroneous non-activation of a conventional capacitive switch.

FIG. 1B shows mis-operation of the capacitive switch. In this case, the capacitance value 10 fails to reach the threshold value for switch operation. The problem shown in FIG. 1B may arise from various factors, such as a gloved hand, dry hand, particularly small finger, and the like.

Figure 1C:
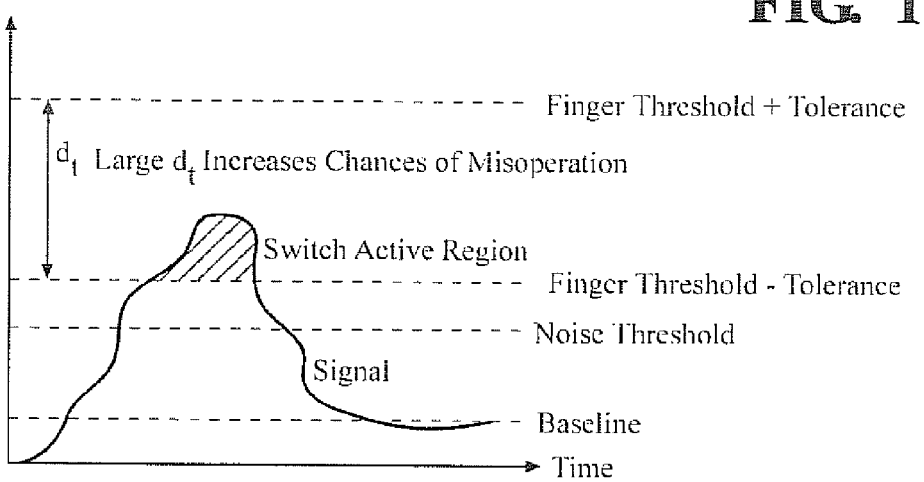
FIG. 1C shows the effect of increased tolerance.

FIG. 1C illustrates a simple but possibly unsatisfactory solution, which is to increase the threshold tolerance, effectively lowering the threshold level for switch operation. However, this increases the risk of inadvertent switch operation or erroneous operation due to electrical noise. If the threshold for switch operation is low enough to account for any source of reduced sensitivity, then overall performance will be compromised.

Figure 2A:
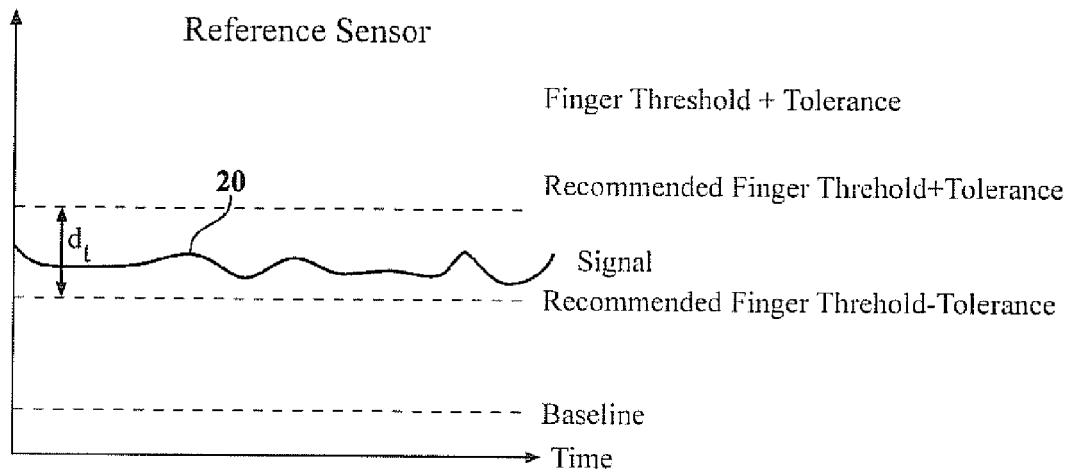
FIG. 2A shows a signal from a reference sensor.
Figure 2B:
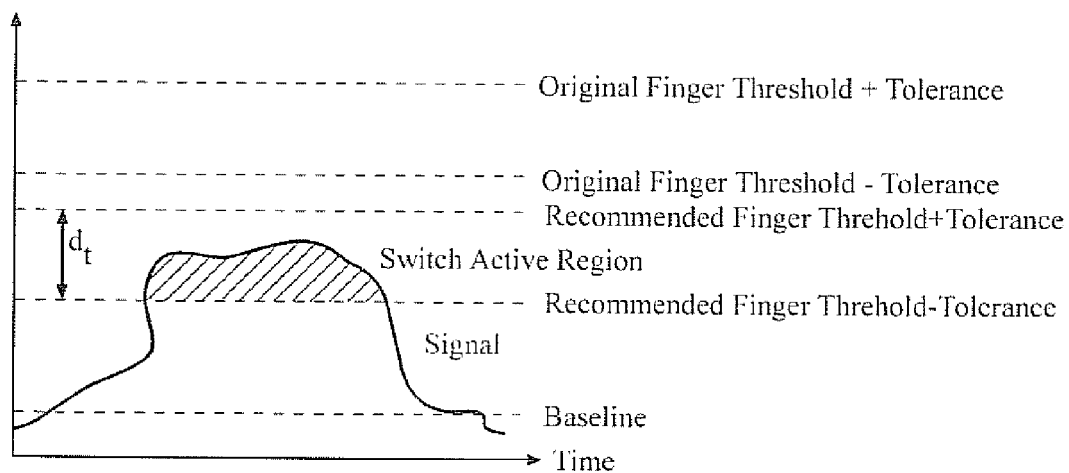
FIG. 2B shows adjustment of the threshold value as a function of the reference signal.

FIGS. 2A-2B illustrate an improved approach using a capacitive reference sensor. The reference sensor may be a similar design to the switch sensor, and is used to provide a reference signal when the operator places a finger on or proximate the reference sensor.

FIG. 2A shows a reference signal 20. The sensor threshold is then adjusted as a function of the reference signal. In examples of the present invention, the recommended finger threshold, and hence the effective threshold level for switch activation, can be determined from the reference signal. For example, an average value of the reference signal may be determined and used as the threshold level for switch activation.

FIG. 2B shows the original finger threshold of a capacitive switch, and an adjusted or recommended finger threshold determined from the reference sensor as shown in FIG. 2A. The thresholds are shown as dashed lines that also indicate the ±tolerance levels. The sensor signal shown in FIG. 2B is sufficient for switch activation, as the sensor signal crosses the recommended threshold level within the shaded region. However, the same sensor signal would not activate the switch using the original finger threshold. This illustrates how adjusting the threshold level using the reference signal improves switch operation.

The tolerance, as illustrated in FIGS. 1A-1C, need not be changed. FIG. 1C shows the recommended finger threshold level unchanged, but the tolerance on the threshold level increased so that effectively the threshold for switch operation is lower.

The threshold for switch activation equal to the recommended finger threshold minus the tolerance is hence adjusted according to the determined reference signal.

For automotive applications, the reference sensor can be located so that an operator touches the reference sensor in normal course of vehicle operation. For example, a reference sensor may be located in the steering wheel. A plurality of reference sensors may be located in the steering wheel to increase the chance of one being touched.

In other examples, the reference sensor may be located in a control component within the vehicle, such as the on/off switch, volume control, or other controller of a radio or other in-car entertainment device, a climate control component, headlight control or other electrical switch, or similar location.

In some examples, the reference sensor may be associated with a vehicle key used to open or turn on the vehicle. For example, the unlock button or other portion of an electronic vehicle key may include a capacitive reference sensor. The reference signal level may be communicated electrically or wirelessly to the electronic circuit that determines the threshold level for a switch sensor.

A reference sensor may be located e.g. in any conventional electrical switch, for example in a button, or within any surface contacted by the operator's finger(s). For example, a reference sensor may be located within a power switch or other portion of an apparatus, and used to adjust threshold levels associated with capacitive switches used in the same apparatus, or any other apparatus.

Figure 3:
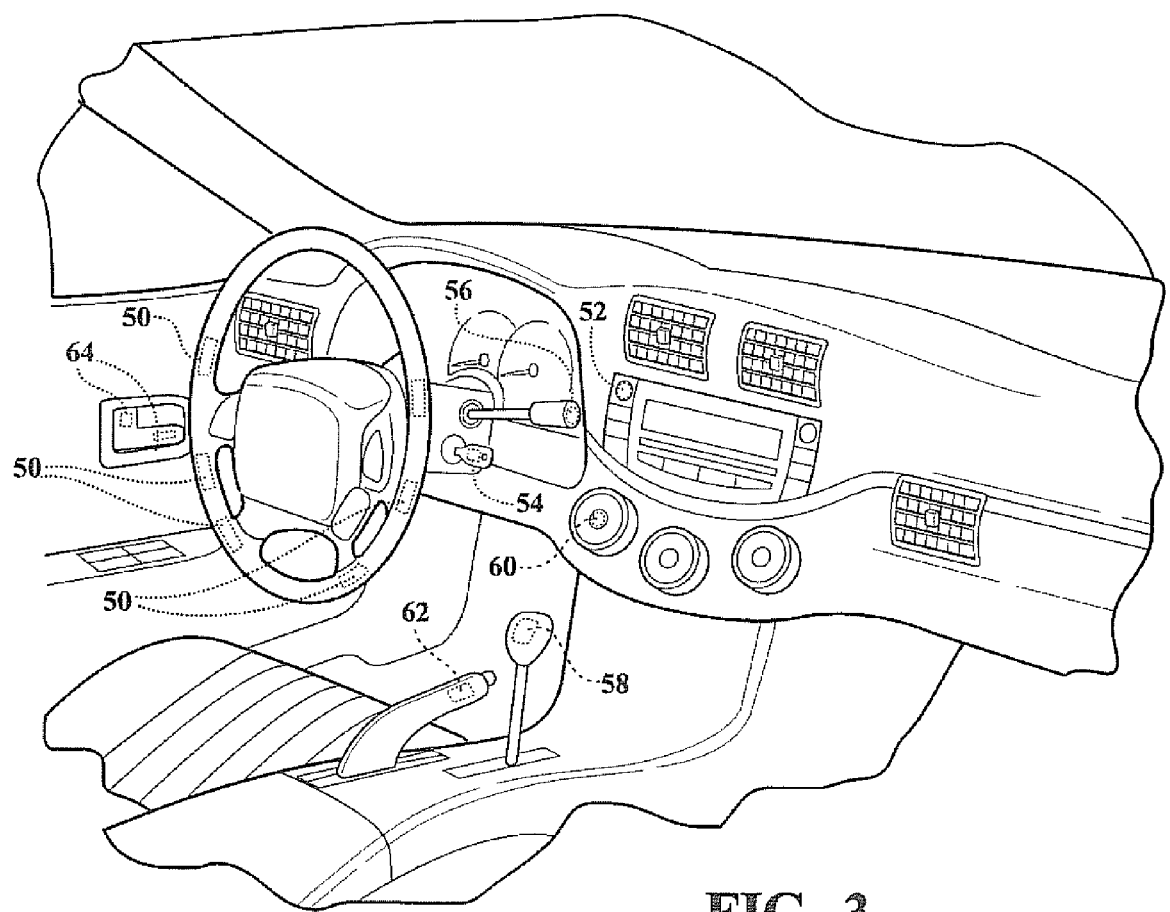
FIG. 3 shows possible reference sensor locations.

FIG. 3 shows possible locations for a reference sensor, such as within the steering wheel 50, radio button 52, key 54, turn signal or other stalk control 56, gearshift knob or other transmission controller 58, climate controller 60, emergency brake handle 62, or door handle 64. Other examples include seat position controllers, exterior door handles, armrests, and the like.

Figure 4:
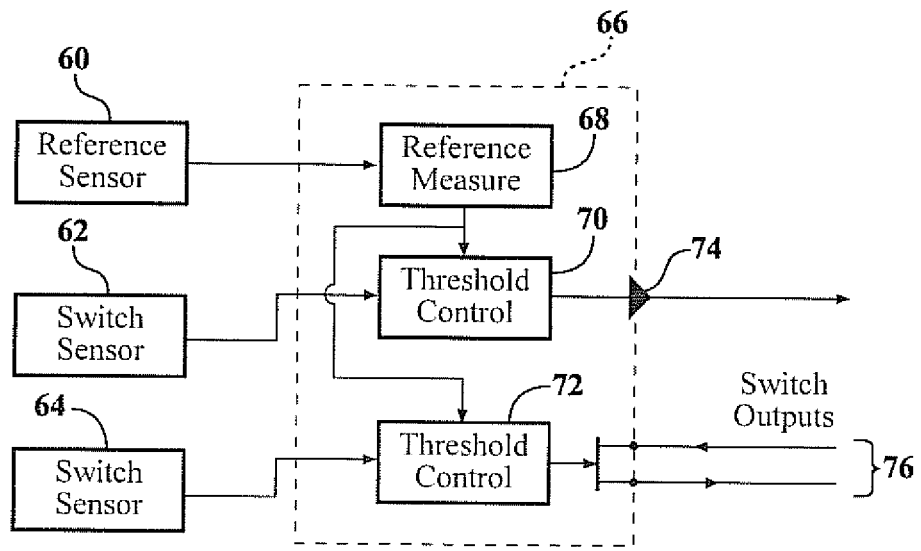
FIG. 4 shows a simplified schematic of a circuit.

FIG. 4 shows a simplified schematic of an example improved capacitive switch apparatus. The apparatus comprises reference sensor 60 and switch sensors 62 and 64. There may be a plurality of switches having the threshold adjusted by a single reference signal. The electronic circuit (control circuit 66) receives the reference signal and the switch sensor signals. In some examples, a plurality of reference sensors may be used and the reference signal determined from one or more of these reference signals.

The control circuit 66 determines the threshold level using reference measurement circuit 68. Collection of the reference signal may be triggered by an electrical signal provided by the component with which the reference sensor is associated. The reference measurement circuit provides a reference signal level (for example an average value of the reference signal collected over a period of time) to threshold control circuits 70 and 72 associated with switch sensors 62 and 64, respectively. The threshold control circuits use the reference signal, in particular the signal level thereof, to adjust the threshold level used to determine switch activation.

The control circuit 66 has switch outputs shown at 74 and 76. Switch output 74 is a signal that goes from low to high on switch activation. Switch output 76 is a two-terminal output that presents low or high impedance, the latter corresponding to switch activation. These configurations are illustrative and exemplary, and any appropriate configuration can be used. For example, the electronic circuit may include a timing circuit that maintains a signal indicating switch activation for a predetermined minimum time. In some example, noise spikes may be excluded, for example by using an upper threshold level above which the switch signal level is not expected to exceed during normal switch activation, or by requiring a minimum predetermined time over which the switch signal indicates switch activation.

In some examples, the electronic circuit is a computer circuit including a microprocessor. The electronic circuit used for adjusting thresholds may include a micro-processor used to adjust the thresholds using software. For example, an algorithm can be used to determine an adjusted threshold level using reference sensor signals collected over a period of time.

Figure 5:
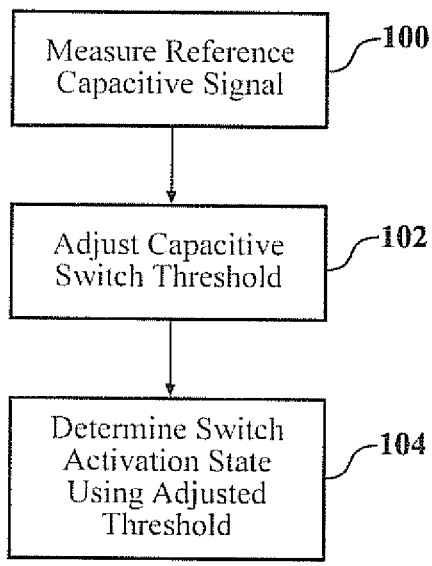
FIG. 5 shows an example process using a reference sensor.

FIG. 5 illustrates an illustrative method. Box 100 represents measuring a reference capacitive signal. Box 102 represents adjusting the threshold of one or more capacitive switches using the reference signal. Box 104 represents determining the activation state of a capacitive switch using the adjusted threshold.

The switch sensor and reference sensor may be of any conventional or otherwise appropriate design. For example, a switch sensor may comprise spaced apart conductive patches with a capacitive coupling to a proximate finger or other body part, as known in the art. The conductive patches may be coated with a thin dielectric layer, for example a plastic layer, or other outer layer of a steering wheel.

A reference sensor may have a generally similar configuration to the switch sensor. If there are differences in configuration between reference and switch sensors, the appropriate threshold level for the switch sensor may be appropriately determined by the electronic circuit, taking these configuration differences into account.

Examples given above relate generally to capacitive sensors. However, analogous configurations can be used for inductive, resistive, optical, and other types of sensor. For example, an inductive switch may comprise an inductive switch sensor providing an inductive switch signal, an inductive reference sensor providing an inductive reference signal; and an electronic circuit receiving the inductive switch signal and the inductive reference signal, the electronic circuit determining switch activation by comparing the inductive switch signal to a threshold signal level, the threshold signal level being adjusted as a function of the inductive reference signal. Analogous examples using resistive switches and other switch technologies are possible. For example, resistive reference sensors can be placed where e.g. a vehicle operator would make skin contact during vehicle operation.

Examples also include improved methods of capacitive switch operation for an electronic device. For example, a reference sensor may be located within a power switch, other portion of the device that may be touched to enable operation, or any portion of the device used for holding the device. A reference signal is used to set the threshold level for one or capacitive switches associated with the device. This may, for example, allow improved use of electronic devices by gloved users. In some examples, a reference sensor may be located within a first device, and reference signals used to adjust capacitive switch thresholds for a second device.

Capacitive switches may be used for a variety of purposes, such as the control of a vehicle or any associated device, such as any vehicle electronic system. Examples include capacitive switches used for climate control adjustment, entertainment devices, navigation systems, and vehicle operation. These examples are illustrative and not limiting to the invention.

If no reference signal is obtained, the threshold may be set at a default level. There may be a number of default levels corresponding to various identified vehicle operators. In some examples, a reference sensor may not be in wired electrical communication with switch sensor and associated switch control electronics, and a reference signal (the term as used herein includes a level thereof) may be wirelessly communicated.

The invention is not restricted to the illustrative examples described above. Examples described are not intended to limit the scope of the invention. Changes therein, other combinations of elements, and other uses will occur to those skilled in the art. The scope of the invention is defined by the scope of the claims.

Having described my invention, I claim:

1. An apparatus, the apparatus being a capacitive switch operated by sensing the presence of a finger: said apparatus comprising:
    a capacitive switch sensor, providing a capacitive switch signal indicating the presence of the finger;
    a capacitive reference sensor, sensing a capacitive reference signal; and
    an electronic circuit, receiving the capacitive switch signal and the capacitive reference signal,
    the electronic circuit detecting switch activation by comparing the capacitive switch signal to a threshold signal level,
    the threshold signal level being adjusted as a function of the capacitive reference signal,
    the capacitive reference sensor sensing the capacitive reference signal only when the finger is in proximity to the capacitive reference sensor.

2. The apparatus of claim 1, the apparatus comprising a plurality of capacitive switch sensors,
    the threshold signal level for each capacitive switch sensor being adjusted as a function of the capacitive reference signal.

3. The apparatus of claim 1, the apparatus being a capacitive switch apparatus for a vehicle,
    the capacitive switch being manually activated by a vehicle operator.

4. The apparatus of claim 3, the capacitive reference sensor being located within a vehicle steering control.

5. The apparatus of claim 4, the vehicle steering control being a steering wheel.

6. The apparatus of claim 3, the capacitive reference sensor being located within a control component associated with the vehicle.

7. The apparatus of claim 6, the control component being a climate control adjuster or an entertainment device controller.

8. The apparatus of claim 3, the capacitive reference sensor being located in a door-handle or armrest of the vehicle.

9. The apparatus of claim 3, the capacitive reference sensor being associated with an ignition key for the vehicle.

10. The apparatus of claim 3, the electronic circuit including a microprocessor,
    the threshold signal level being adjusted using software executed by the microprocessor.

11. A capacitive switch apparatus for a vehicle operated by sensing the presence of a vehicle operator hand; said apparatus comprising:
    a capacitive switch sensor, operable to provide a capacitive switch signal indicating the presence of the vehicle operator hand;
    a capacitive reference sensor, operable to sense a capacitive reference signal; and
    an electronic circuit, receiving the capacitive switch signal and the capacitive reference signal,
    the electronic circuit detecting switch activation by comparing the capacitive switch signal with a threshold signal level,
    the threshold signal level being adjusted as a function of a signal level of the capacitive reference signal,
    the capacitive reference signal being sensed only during periods when the vehicle operator hand is in proximity to the capacitive reference sensor.

12. The apparatus of claim 11, the capacitive reference signal being sensed at intervals during vehicle operation, the threshold level being further adjusted as a function of changes in the capacitive reference signal.

13. The apparatus of claim 11, the vehicle having a steering wheel, the capacitive reference sensor being located within the steering wheel.

14. The apparatus of claim 11, the capacitive reference sensor being located on or within a control component associated with the vehicle.

15. The apparatus of claim 14, the control component being selected from the group consisting of a steering wheel, a climate control, an entertainment device control, a seat adjustment, and an ignition key.

16. A method of detecting an activation of a capacitive switch within a vehicle by sensing the presence of a hand of a vehicle operator, the method comprising:

sensing a reference signal from a capacitive reference sensor only when the hand of the vehicle operator is proximate the capacitive reference sensor;

using the reference signal to adjust a threshold level for switch activation to determine an adjusted threshold level;

obtaining a capacitive switch signal from a capacitive switch sensor;

comparing the capacitive switch signal with the adjusted threshold level to detect activation of the capacitive switch.

17. The method of claim 16, the capacitive reference sensor being located so that starting and operating the vehicle brings the hand of the vehicle operator proximate the capacitive reference sensor.

* * * * *